United States Patent
Venkataraman et al.

(10) Patent No.: US 10,425,044 B1
(45) Date of Patent: Sep. 24, 2019

(54) CANCELLATION CAPACITOR FOR ALIASING AND DISTORTION IMPROVEMENT

(71) Applicant: TEXAS INSTRUMENTS INCORPORATED, Dallas, TX (US)

(72) Inventors: Jagannathan Venkataraman, Bengaluru (IN); Eeshan Miglani, Chhindwara (IN); Karthikeyan Gunasekaran, Chennai (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/192,048

(22) Filed: Nov. 15, 2018

(51) Int. Cl.
| H03F 1/32 | (2006.01) |
| H03F 1/30 | (2006.01) |
| H03F 1/18 | (2006.01) |
| H03F 5/00 | (2006.01) |

(52) U.S. Cl.
CPC .......... *H03F 1/3247* (2013.01); *H03F 1/303* (2013.01)

(58) Field of Classification Search
CPC ........ H03F 1/3247; H03F 1/303; H03F 3/189; H03F 2200/252; H03F 2200/294; H03F 2200/42; H03H 7/0153; H03L 5/00
See application file for complete search history.

(56) References Cited

U.S. PATENT DOCUMENTS

| | | | | |
|---|---|---|---|---|
| 7,138,873 B2 * | 11/2006 | Chandra | .................. | H03F 1/34 330/303 |
| 7,146,141 B2 * | 12/2006 | Chen | ..................... | H03D 3/008 455/232.1 |
| 7,155,185 B2 * | 12/2006 | Pipilos | .................. | H04L 25/061 455/232.1 |
| 7,356,317 B2 * | 4/2008 | Xu | ....................... | H03D 7/1441 330/259 |
| 7,477,885 B2 * | 1/2009 | Rostami | .................. | H04B 1/30 455/266 |
| 8,045,949 B2 * | 10/2011 | Oishi | ..................... | H04B 1/123 375/346 |
| 8,175,535 B2 * | 5/2012 | Mu | ........................ | H04B 1/123 455/283 |
| 8,989,688 B2 * | 3/2015 | Mikhemar | .............. | H04B 1/18 455/127.2 |
| 9,209,910 B2 * | 12/2015 | Hedayati | .............. | H04B 15/005 |
| 9,413,301 B2 * | 8/2016 | Mattisson | .............. | H03F 3/189 |

(Continued)

*Primary Examiner* — Pablo N Tran
(74) *Attorney, Agent, or Firm* — John R. Pessetto; Charles A. Brill; Frank D. Cimino (57) ABSTRACT

A circuit includes first and second operational amplifiers, each including positive and negative inputs and first and second internal nodes. A mixer couples first and second input nodes to the positive and negative inputs of the operational amplifiers. The mixer switches the first and second input nodes between the positive and negative inputs of the first and second operational amplifiers in accordance with clock signals. A first cancellation capacitor couples to the first input node, and a second cancellation capacitor couple to the second input node. First and second switches selectively couple the first cancellation capacitor to the first and second internal nodes, respectively, of the first operational amplifier. Third and fourth switches selectively couple the second cancellation capacitor to the first and second internal nodes, respectively, of the second operational amplifier.

20 Claims, 5 Drawing Sheets

(56) References Cited

U.S. PATENT DOCUMENTS

| | | | |
|---|---|---|---|
| 9,660,665 B2 | 5/2017 | Miglani et al. | |
| 2013/0120048 A1* | 5/2013 | Na | H03F 3/189 |
| | | | 327/307 |
| 2015/0162940 A1* | 6/2015 | Mikhemar | H04B 1/18 |
| | | | 455/284 |
| 2017/0230019 A1* | 8/2017 | Chandrakumar | A61B 5/7203 |

* cited by examiner

CANCELLATION CAPACITOR FOR ALIASING AND DISTORTION IMPROVEMENT

BACKGROUND

Many zero IF receivers suffer from 1/f flicker noise in the baseband signal chain. Further, distortion caused by a transimpedance amplifier is amplified by the switched capacitance equivalent resistance of a mixer switch. The amount of distortion increases as frequency increases.

SUMMARY

In one example, a circuit includes an operational amplifier including a positive input, a negative input, a first internal node that is to include a voltage that is based on and larger than a voltage on the positive input, and a second internal node that is to include a voltage that is based on and larger than a voltage on the negative input. The circuit also includes a first input node and a second input node of the circuit, as well as a mixer including a plurality of switches to switch the first and second input nodes between the positive and negative inputs of the operational amplifier in accordance with clock signals controlling the plurality of switches in the mixer. The plurality of switches includes a first switch to selectively couple the first input node to the negative input of the operational amplifier and a second switch to selectively couple the first input node to the positive input of the operational amplifier. A cancellation capacitor is coupled to the first input node. A third switch selectively couples the cancellation capacitor to the first internal node of the operational amplifier. A fourth switch selectively couples the cancellation capacitor to the second internal node of the operational amplifier. The second and third switches receive a first clock signal and the first and fourth switches receive a second clock signal.

In another example, a circuit includes first and second operational amplifiers, each operational amplifier including a positive input, a negative input, a first internal node that is to include a voltage that is based on and larger than a voltage on that operational amplifier's positive input, and a second internal node that is to include a voltage that is based on and larger than a voltage on that operational amplifier's negative input. The circuit includes a first input node and a second input node, as well as a mixer coupled to the first and second input nodes and to the positive and negative inputs of the first and second operational amplifiers. The mixer switches the first and second input nodes between the positive and negative inputs of the first and second operational amplifiers in accordance with clock signals. A first cancellation capacitor couples to the first input node, and a second cancellation capacitor couple to the second input node. First and second switches selectively couple the first cancellation capacitor to the first and second internal nodes, respectively, of the first operational amplifier. Third and fourth switches selectively couple the second cancellation capacitor to the first and second internal nodes, respectively, of the second operational amplifier.

In yet another example, a circuit includes an operational amplifier including a positive input, a negative input, a first internal node that is to include a voltage that is based on and larger than a voltage on the positive input, and a second internal node that is to include a voltage that is based on and larger than a voltage on the negative input. The circuit also includes a first input node and a second input node. A mixer couples to the first and second input nodes and to the positive and negative inputs of the operational amplifier. The mixer switches the first and second input nodes between the positive and negative inputs of the operational amplifier. A first cancellation capacitor couples to the first input node. First and second switches selectively couple the first cancellation capacitor to the first and second internal nodes, respectively, of the operational amplifier

BRIEF DESCRIPTION OF THE DRAWINGS

For a detailed description of various examples, reference will now be made to the accompanying drawings in which.

DETAILED DESCRIPTION

Figure 1:
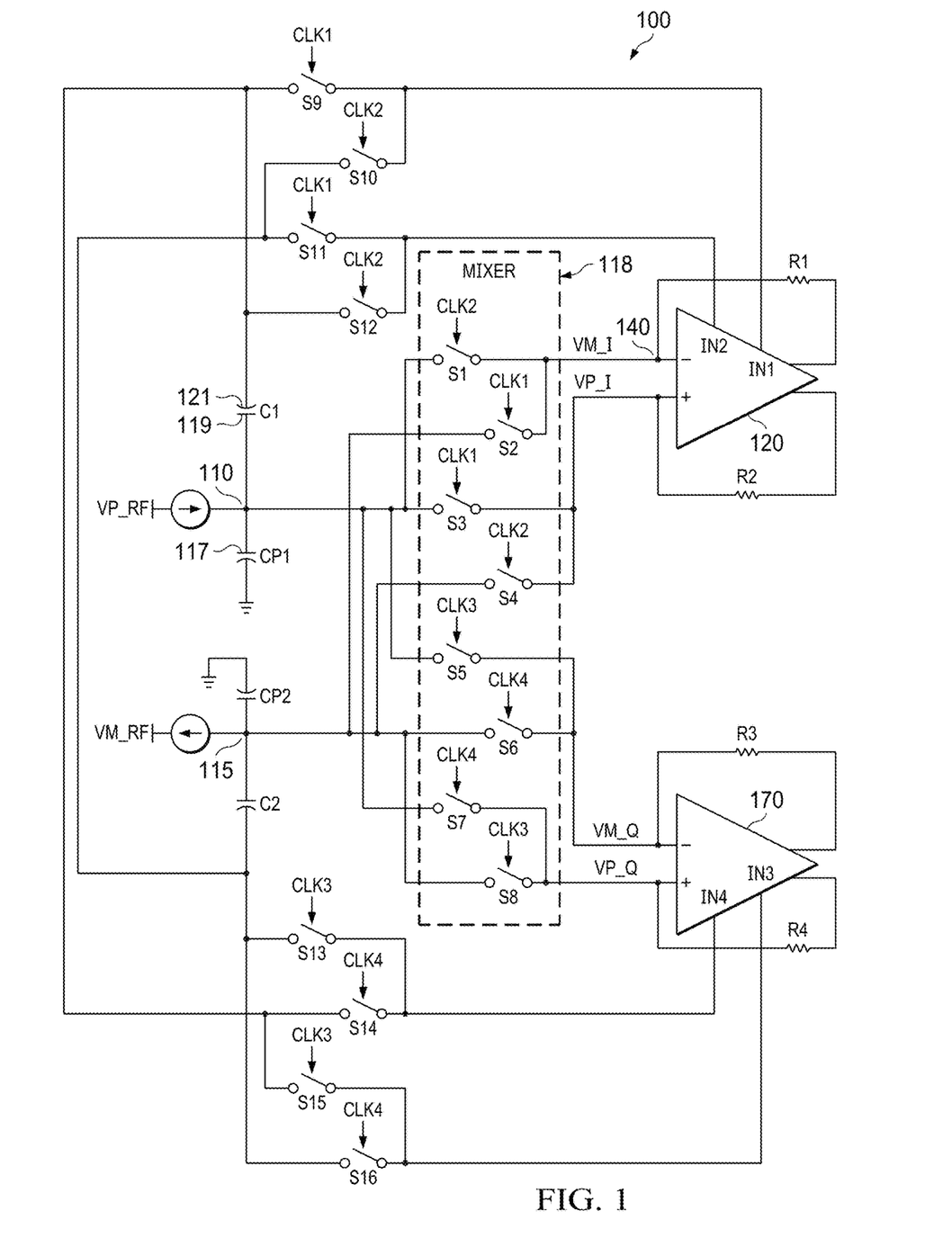
FIG. 1 illustrates a receiver including cancellation capacitors in accordance with an example.

FIG. 1 shows an example of at least a portion of a radio frequency (RF) receiver 100. The RF receiver 100 includes input nodes 110 and 115, a mixer 118, and operational amplifiers 120 and 170. Operational amplifier 120 includes a negative input (−) and a positive input (+). The voltage on the negative input is designated as VM_I and the voltage on the positive input is designated as VP_I. Operational amplifier 120 also includes an internal node IN1 and an internal node IN2, which are shown in an example in FIG. 4. Internal node IN1 has a voltage that is generated based on the VP_I and is larger in magnitude than VP_I by a gain factor G. Thus, the voltage on IN1 is G×VP_I. Internal node IN2 has a voltage that is generated based on the VN_I and is larger in magnitude than VN_I also by gain factor G. Thus, the voltage on IN2 is G×VN_I. The gain factor G is application-specific. Feedback resistor R1 couples one output of operational amplifier 120 to its negative input as shown, and feedback resistor R2 couple the another output of operational amplifier 120 to its positive input. Similarly, feedback resistors R3 and R4 couple the outputs of operational amplifier 170 to its negative and positive inputs, respectively.

Capacitance CP1 and CP2 represents parasitic capacitances that are modeled as capacitors between the input nodes 110, 115 and ground as shown. Absent cancellation capacitors C1, C2 and switches S9-S16 (which will be discussed below), the parasitic capacitance represented by CP1 and CP2 cause noise on the outputs of the operational amplifiers. The mixer 118 includes switches S1, S2, S3, S4, S5, S6, S7, and S8. The switches S1-S8 are operated by clock signals CLK1, CLK2, CLK3, and CLK4 as shown to selectively couple input nodes 110 and 115 to any of the positive and negative inputs of either operational amplifier 120, 170.

Assuming cancellation capacitors C1, C2 and switches S9-S16 are not present, when switches S2 and S3 are closed (due to assertion of CLK1), input 110 is coupled to the positive input of operational amplifier 120 and input 120 is coupled to the negative input of operational amplifier 120.

The voltage across CP1 thus is VP_I. Then, when switches S2 and S3 are open (de-assertion of CLK1) and switches S1 and S4 are closed (assertion of CLK2), the voltage on CP1 becomes VM_I. As the voltage on the CP1 changes from VP_I to VM_I, the difference in charge on the positive plate of the capacitor, which is the value of the capacitance of CP1 times the voltage difference VP_I–VM_I, flows onto node 140 and through feedback resistor R1 thereby representing noise in the output of the operational amplifier. A similar effect occurs as the input nodes 110, 115 are repeatedly switched through mixer 118 between operational amplifier inputs. The noise results from the commutating switch behavior of the mixer as the parasitic capacitances CP1 and CP2 are coupled to the virtual grounds of the operational amplifiers 120, 170.

The RF receiver 100 includes cancellation capacitors C1 and C2 and switches S9-S16. Cancellation capacitor C1 couples to input node 110 and to a terminal of switch S9 and to a terminal of switch S12. The other terminal of switch S9 couples to the internal node IN1 of the operational amplifier 120. The other terminal of switch S12 couples to the internal node IN2 of the operational amplifier 120. Thus, through switches S9 and S12 cancellation capacitor C1 can be coupled to either internal node IN1 or IN2.

Similarly, cancellation capacitor C2 couples to input node 115 and to a terminal of switch S13 and to a terminal of switch S16. The other terminal of switch S13 couples to the internal node IN4 of the operational amplifier 120, and the other terminal of switch S16 couples to the internal node IN3 of the operational amplifier 120. Thus, through switches S13 and S16 cancellation capacitor C2 can be coupled to either internal node IN3 or IN4. Switches S10 and S11 selectively couple internal nodes IN1 and IN2 of operational amplifier 120 to cancellation capacitor C2, and similarly switches S14 and S15 selectively couple internal nodes IN4 and IN3, respectively, of operational amplifier 120 to cancellation capacitor C1.

There are 16 switches S1-S16 in the example of FIG. 1 and groups of four of the switches are controlled by the same clock signal. For example, switches S2, S3, S9, and S11 are controlled by CLK1. Switches S1, S4, S10, and S12 are controlled by CLK2. Switches S5, S8, S13, and S16 are controlled by CLK3. Switches S6, S7, S14, and S15 are controlled by CLK4. When any of the clocks CLK1-CLK4 are high, the corresponding switches are closed (turned on) and when the clocks are low, the corresponding switches are open (turned off). In other examples, the switches are turned on upon the corresponding clock being low.

When, for example, CLK1 is asserted high, switches S2, S3, S9, and S11 are closed, and the remaining switches in the example of FIG. 1 remain in an open state. In this configuration, input node 110 is coupled to the positive input of operational amplifier 120 and input node 115 is coupled to the negative input of the operational amplifier 120. Further, cancellation capacitor C1 is coupled to the internal node IN1 and cancellation capacitor C2 is coupled to internal node IN2 of operational amplifier 120. In this configuration, the charge on the positive plate 117 of CP1 is the capacitance of CP1 times the voltage VP_I across CP1, that is, CPI×VP_I (where CP1 is the capacitance of parasitic capacitance CP1). The charge on the positive plate 119 of cancellation capacitor C1 is the capacitance of cancellation capacitor C1 times the voltage across C1. The size of cancellation capacitor C1 (and C2) is selected to be CP1/(G−1), where G is the gain factor of the internal node IN1 compared to voltage VP_I (G=IN1 voltage/VP_I, and thus IN1 voltage is G×VP_I). The voltage on the positive plate 119 of C1 is VP_I and the voltage on the negative plate 121 is the voltage on internal node IN1, which is G×VP_I. Thus, the charge on the positive plate 119 of the cancellation capacitor C1 is $$\frac{CP1}{G-1}(VP\_I - G{\times}VP\_I) = -CP1{\times}VP\_I$$

The total charge on input node 110 is thus the charge on the positive plate of CP1 plus the charge on the positive plate of C1, which is (CPI×VP_I)+(−CPI×VP_I)=0. A net zero charge is thus present at the input node 110 and thus no charge is transferred into the feedback resistors R1 or R2 of the operational amplifier 120, thereby reducing the noise problem discussed above.

A similar analysis occurs when CLK1 is deasserted and CLK2 is asserted. When CLK2 is asserted high, switches S1, S4, S10, and S12 are closed, and the remaining switches in the example of FIG. 1 remain in an open state. In this configuration, input node 110 is coupled to the negative input of operational amplifier 120 and input node 115 is coupled to the positive input of the operational amplifier 120. Further, cancellation capacitor C1 is coupled to the internal node IN2 and cancellation capacitor C2 is coupled to internal node IN1 of operational amplifier 120. In this configuration, the charge on the positive plate 117 of CP1 is the capacitance of CP1 times the voltage VM_I across CP1, that is, CPI×VM_I. The charge on the positive plate 119 of cancellation capacitor C1 is the capacitance of cancellation capacitor C1 times the voltage across C1. The voltage on the positive plate 119 of C1 is VM_I and the voltage on the negative plate 121 is the voltage on internal node IN2, which is G×VM_I. Thus, the charge on the positive plate 119 of the cancellation capacitor C1 is $$\frac{CP1}{G-1}(VM\_I - G{\times}VM\_I) = -CP1{\times}VM\_I$$

The total charge on input node 110 is thus the charge on the positive plate of CP1 plus the charge on the positive plate of C1, which is (CPI×VM_I)+(−CPI×VM_I)=0. As described above, a net zero charge is thus present at the input node 110 and thus no charge is transferred into the feedback resistors R1 or R2 of the operational amplifier 120, thereby reducing the noise problem discussed above.

The cancellation capacitor C1 provides a path for the charge on CP1 is discharge, rather than discharging through the feedback resistors R1, R2 of operational amplifier 120. Further, voltages of the internal nodes IN1 and IN2 are used to couple to the cancellation capacitor C1 so that the size of C1 can be relatively small. The internal node voltages are larger than the voltages VM_I and VP_I on the positive and negative inputs of the operational amplifier and thus a smaller capacitance value can be selected for the cancellation capacitor C1 to result in a net zero charge on input node 110.

A similar analysis applies to the net charge on input node 115 when CLK3 is asserted and when CLK4 is asserted. Due to the presence of the cancellation capacitor C2, the net charge on input node 115 is zero. When CLK3 is asserted, switches S5, S8, S13 and S16 are closed, and when CLK4 is asserted, switches S6, S7, S14, and S15 are closed.

Figure 2:
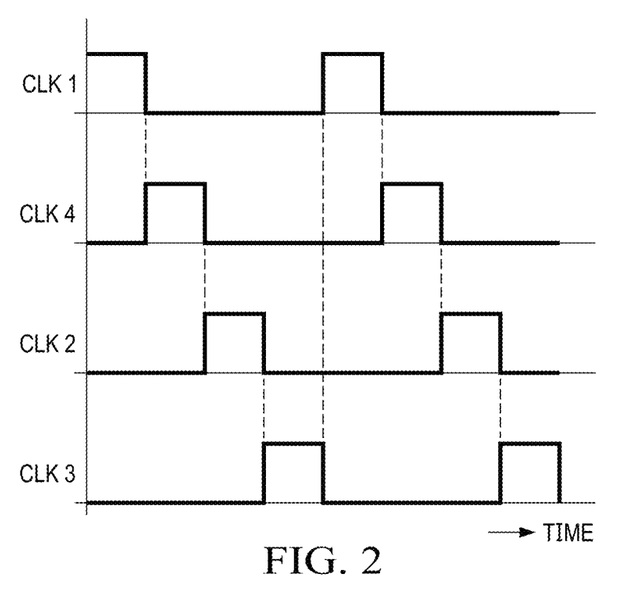
FIG. 2 shows a timing diagram of clock signals usable in the receiver of FIG. 1.

FIG. 2 provides a timing diagram illustrating an example of the relative timing of CLK1-CLK4. In this example, only one clock is asserted at a time. CLK1 is asserted followed by CLK4, then CLK2, and finally CLK3, and the cycle repeats.

Figure 3:
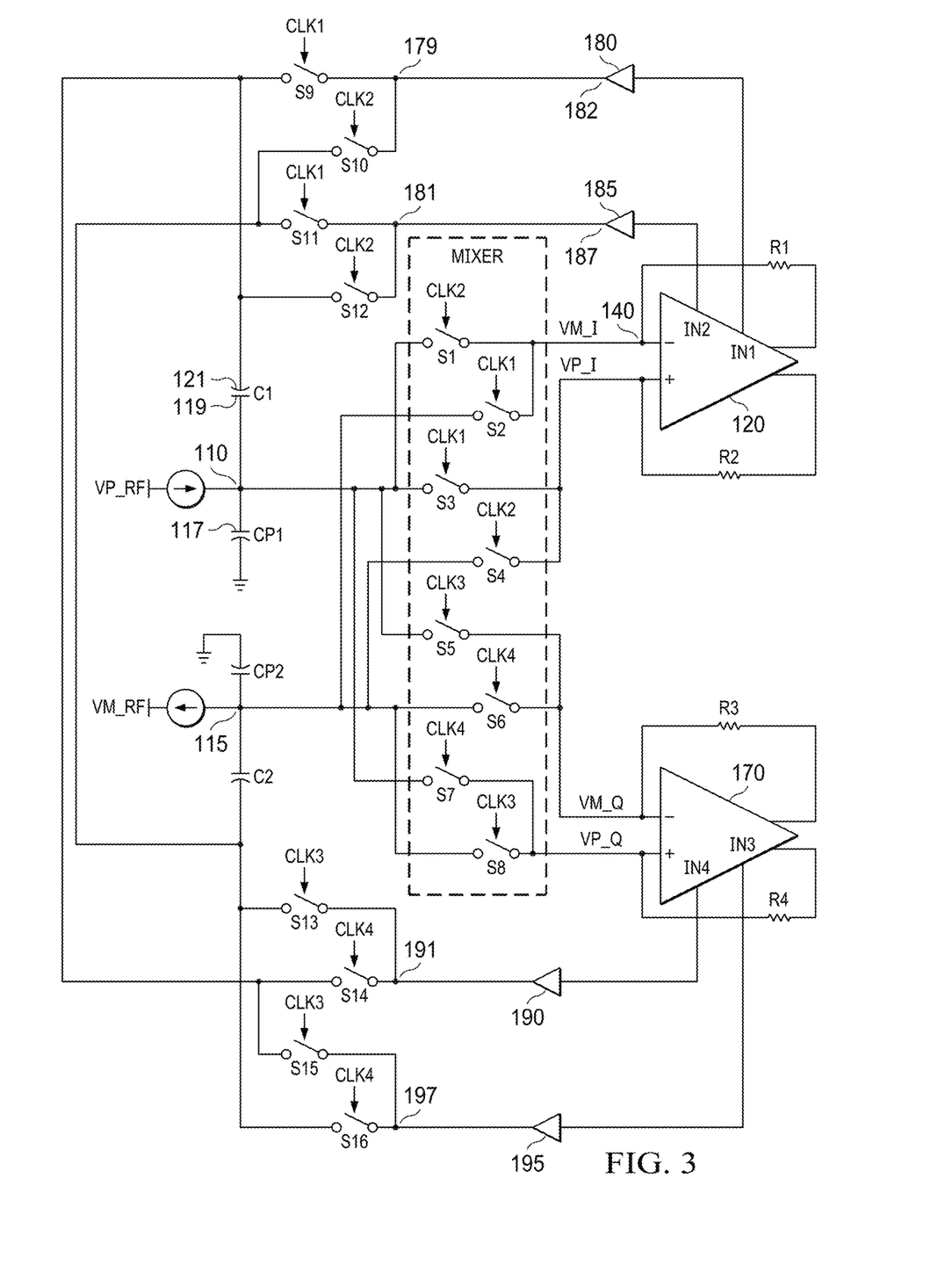
FIG. 3 shows another example of a receiver with cancellation capacitors and buffers.

The example of FIG. 3 is similar to the example of FIG. 1. FIG. 3, however, includes buffers 180, 185, 190, and 195. In applications in which the inclusion of cancellation capacitors C1 and C2 may undesirably alter the bandwidth of the operational amplifiers 120, 170, the buffers 180, 185, 190, and 195 can be included to reduce the effects of such loading by cancelation capacitors C1, C2. In the example of FIG. 3, the buffers 180, 185, 190, and 195 are provided between the operational amplifiers' internal nodes and the switches. For example, buffer 180 is coupled between IN1 and node 179 connecting switch S9 to switch S10. Similarly, buffer 185 is coupled between IN2 and node 181 connecting switch S11 to switch S12. Buffer 190 is coupled between IN4 (of operational amplifier 170) and node 191 connecting switch S13 to switch S14, and buffer 195 is coupled between IN3 and node 197 connecting switch S15 to switch S16.

Figure 4:
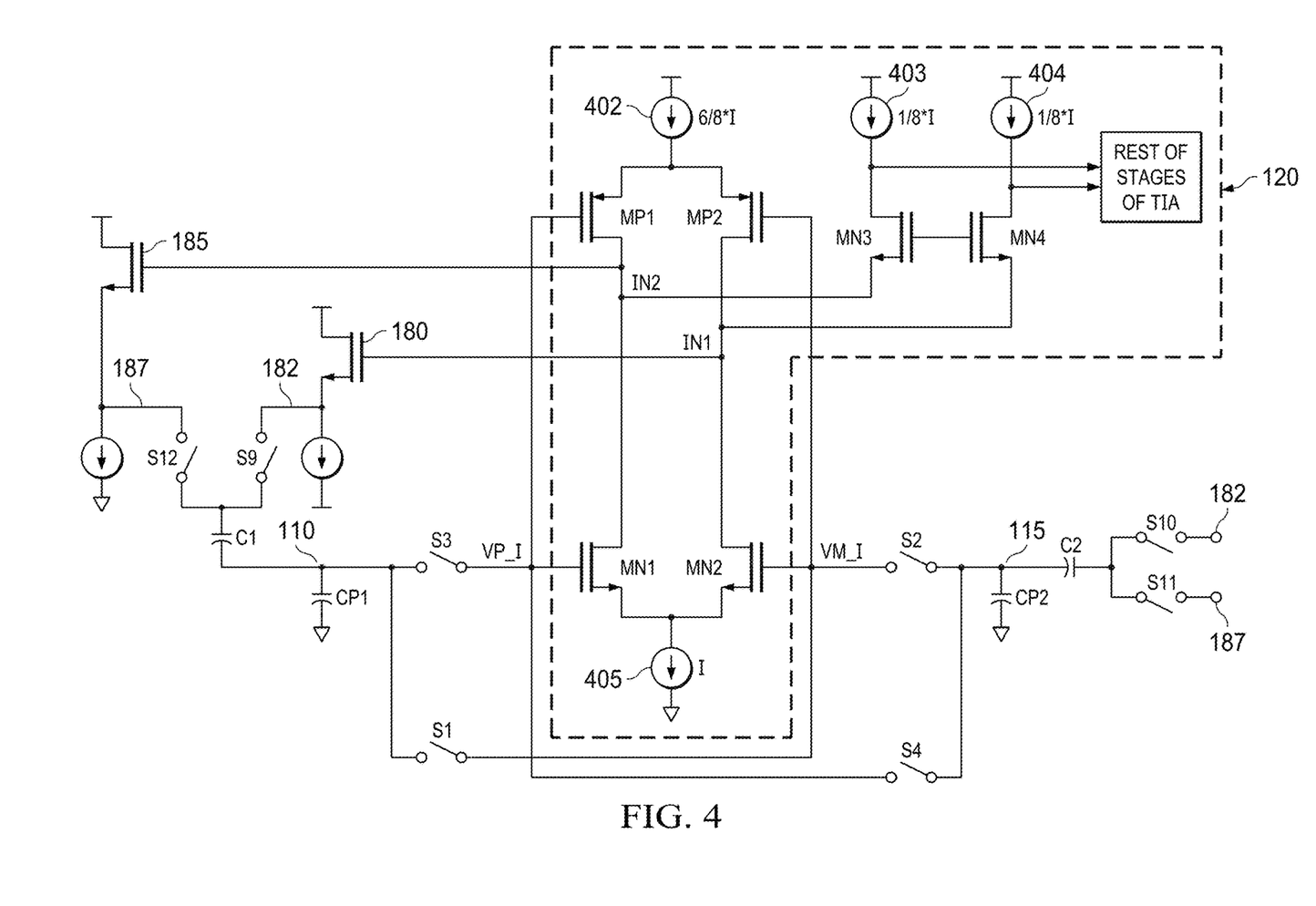
FIG. 4 shows a portion of an operational amplifier and internal nodes usable to be coupled to the cancellation capacitors of FIGS. 1 and 3.

FIG. 4 shows an example of a portion of operational amplifier 120 in conjunction with some of the other components shown in FIG. 1. In FIG. 4, a front-end portion of the operational amplifier 120 is shown comprising p-type metal oxide semiconductor field effect transistors (PMOS) MP1 and MP2, n-type metal oxide semiconductor field effect transistors (NMOS) MN1 and MN2, and current sources 402, 403, 404, and 405. MN1 and MN2 form a differential input for the operational amplifier. The sources of MP1 and MP2 are coupled together and to current source 402. The sources of MN1 and MN2 are coupled together and to current source 405. The drains of MP1 and MN1 are coupled together as well are the drains of MP2 and MN2. Current source 403 couples through NMOS MN3 to internal node IN2, and current source 404 couples through NMOS MN4 to internal node IN1. The differential input of the operational amplifier 120 thus includes the Internal nodes IN1 and IN2. In other implementations, different types of transistors can be used for the transistors shown in FIG. 4 (e.g., NMOS instead of PMOS and vice versa, bipolar junction transistors instead of MOS devices, etc.).

The current sources 402-405 may be implemented as transistors and sized as indicated in FIG. 4. That is, the transistors comprising current sources 403, 404 are of equal size and one-sixth the size of the transistor comprising current source 402. The transistor comprising current source 405 is eight times the size of the transistors comprising either current source 403 or 404 and eight-sixths the size of the transistor comprising current source 402. As such, if the current through current source 405 is I, then 6/8*I current flows through current source 402 and 1/8*I current flows through each current sources 403 and 404.

At a higher transconductance level, transistors MN1, MN2, MN3, MN4, MP1 and MP2 operate in the deep subthreshold region. As such, the transconductance of these transistors is proportional to the current flowing through them. Thus, if the transconductance of MN1 and MN2 is gm, the transconductance of MP1 and MP2 is 6/8*gm and the transconductance of MN3 and MN4 is gm/4. Consequently, current equal to $(gm+6/8*gm)*(VP\_I-VM\_I)/2$ flows through MN3, which forces the node IN2 to have a voltage swing of $-((gm+6/8*gm)*(VP\_I-VM\_I)/2)/(gm/4)$ for MN3 to be able to conduct the current. Similarly IN1 will have a voltage swing of $-((gm+6/8*gm)*(VM\_I-VP\_I)/2)/(gm/4)$. Thus, $IN2-IN1=(VP\_I-VM\_I)*7$, which results in an increased voltage level on IN1 and IN2.

Buffers 180 and 185 configured as source-followers are shown in the example of FIG. 4 as NMOS devices (although PMOS or bipolar junction devices can be used as well).

Switches S9 and S12 are shown connected to buffers 180 and 185, respectively. The output node 182 of buffer 180 is shown connected to switch S10 (although the signal line interconnecting those points has been omitted for clarity in reviewing the schematic of FIG. 4). Similarly, the output node 187 of buffer 185 is shown connected to switch S11. FIG. 4 does not show operational amplifier 170 nor switches S5-S8, or S13-S16, but that part of the circuit would be similar to that shown in FIG. 4 for operational amplifier 120.

Figure 5:
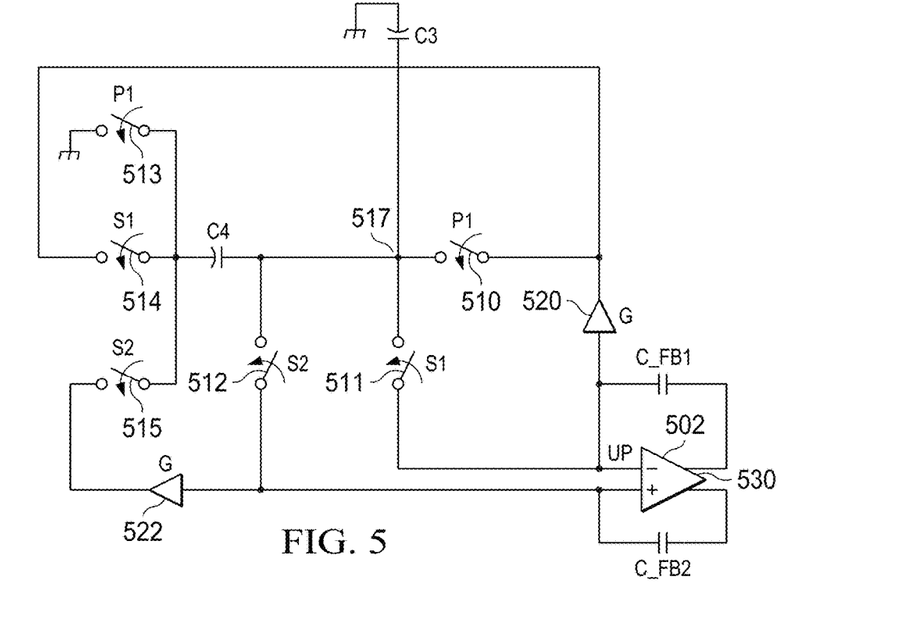
FIG. 5 shows a portion of a switched capacitive, digital-to-analog converter in accordance with an example.

FIG. 5 is directed to at least a portion of a switched capacitive, digital-to-analog converter (DAC) comprising switches 510, 511, 512, 513, and 514, capacitors C3 and C4, operational amplifier 502, feedback capacitors C_FB1 and C_FB2, and gain buffers 520 and 522 (each with a gain of G). C_FB1 connects between the inverting input (−) of operational amplifier 502 and its output, and C_FB2 connects between the non-inverting (+) input of operational amplifier 502 and its output. Switch 511 connects between the inverting and C3 at node 517, and C3 also connects to ground as shown. Switch 510 connects between a reference voltage (VREF) and the positive plates of C3 and C4 at node 517. The negative plate of C4 connects to switches 513-514. The opposing terminal of switch 513 connects to ground. The opposing terminal of switch 514 connects to the output of gain buffer 520, and the opposing terminal of switch 515 connects to the output of gain buffer 522. The inverting input of the operational amplifier 530 connects to the input of gain buffer 520, and the non-inverting input of the operational amplifier connects to the input of gain buffer 522.

The capacitance value of C3 is "C" and the capacitance value of C4 is $C/(G-1)$, where G is the gain factor of the gain buffers 520 and 522. Alternatively stated and mathematically the same as C3 having a capacitance of C and C4 being $C/(G-1)$, C3 has a capacitance of $C/G(G-1)$ and C4 has a capacitance of $C/G$.

During a first phase (P1), switches 510 and 513 are closed and switches 511, 512, 514, and 515 are open to charge C3 to the reference voltage VREF. During a second phase (P2), switches 510 and 513 are opened. In the second stage, if an input digital bit is a 1, switches 511 and 514 are closed (as indicated by "S1"), and if the input digital bit is a 0, switches 512 and 515 instead are closed (as indicated by "S2"). The operation of the switched capacitor DAC should transfer a charge to one of the feedback capacitors C_FB1 or C_FB2 equal to the charge on C3 when the switches are switched to the P2 state, that is, a charge equal to C*VREF should be transferred from C3 to a feedback capacitor. This occurs in an ideal case if the voltage on the − and + inputs of the operational amplifier 502 are equal to each other and equal to 0 V. However, this ideal condition is not always present. The example in FIG. 5 includes capacitor C4 and the gain buffers 520, 522 along with switches 514 and 515 to effectuate the proper transfer of charge (C*VREF) as explained below.

In the P1 phase, the voltage on node 517 is VREF. During the P2 phase (and assuming state S1 for the digital input bit), the voltage on node 517 becomes the voltage on the inverting input of the operational amplifier 502. Referring to the voltage on the inverting input as Vp (which ideally is 0V but can be different than 0V in practice), the charge on node 517 is the charge on the positive plate of C3 plus the charge on the positive plate of C4. The charge on the positive plate of C3 is the capacitance of C3 times the voltage difference across C3 between states P1 and P2, that is $$(VREF - Vp) * \frac{C}{G}(G-1).$$

The charge on the positive plate is the capacitance of C4 times the voltage difference across C4 between states P1 and P2, that is $$(VREF - (VREF - G*Vp)) * \frac{C}{G}$$

which equals C*VREF. As such, a charge of C*VREF is transferred to C_FB1. During state S2 (digital input bit is 0), the same condition holds that a charge of C*VREF is transferred to C_FB2.

In the example of FIG. 5, gain buffers 520, 522 are included to generate the appropriate voltage to be provided to the negative plate of C4 through switch 514 (or 515 depending on the digital input bit state) so that the charge balance process occurs as explained above. In other examples, however, internal nodes within the operational amplifier may include a gained-up voltage of the voltage on the input terminal and that internal node voltage can be used instead of including the gain buffers 520, 522 (similar to nodes IN1, IN2 in FIG. 1).

Figure 6:
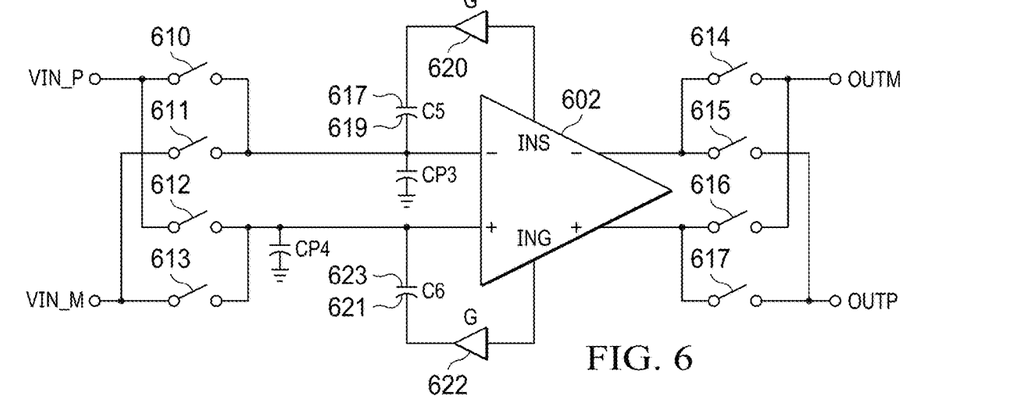
FIG. 6 illustrates the use of cancellation capacitors in a chopping circuit.

FIG. 6 shows an example for using charge cancellation capacitors in a chopping circuit. The circuit includes an operational amplifier 602, switches 61-617, capacitors C5 and C6, and gain buffers 620 and 622. Capacitors CP3 and CP4 represent parasitic capacitances. Switches 610 and 612 couple an input voltage VIN_P to either the inverting or non-inverting inputs of operational amplifier 602. Similarly, switches 611 and 613 couple an input voltage VIN_M to either the inverting or non-inverting inputs of operational amplifier 602. Switches 614 and 616 couple the positive or negative output from operational amplifier 602 to an output node OUTM. Switches 615 and 617 couple the positive or negative output from operational amplifier 602 to an output node OUTP.

The switches are controlled by control signals that implement two states. In one state, switches 610, 613, 614, and 617 are closed and switches 611, 612, 615, and 616 are open thereby coupling VIN_P to the inverting input of operational amplifier 602, VIN_M to the non-inverting input, the positive output to output node OUTP and the negative output to output node OUTM. In another state, switches 611, 612, 615, and 616 are closed and switches 610, 613, 614, and 617 are open thereby coupling VIN_P to the non-inverting input of operational amplifier 602, VIN_M to the inverting input, the positive output to output node OUTM and the negative output to output node OUTM. The use of the operational amplifier's positive and negative inputs and outputs are repeatedly switched (chopped) by switching the states of switches 610-617. Such chopping circuits can be used in discrete analog-to-digital converters (ADCs) such as pipeline and continuous-time ADC's that use switched capacitor DACs.

The inclusion of the gain buffers 620, 622 and charge cancellation capacitors C5 and C6 mitigate the excess charge that could develop on the inverting and non-inverting inputs of operational amplifier 602 as described previously. Internal nodes IN5 and IN6 within operational amplifier 602 provide a voltage that generally tracks, but may not be exactly the same as, the corresponding inverting or non-inverting input. The respective gain buffer 620, 622 amplifies the voltage on the IN5 and IN6 nodes by a factor of G and provides the amplified voltage to the positive plates 617 and 621 of capacitors C5 and C6. The negative plates 619 and 623 of capacitors C5, C6 are connected to the positive plates of CP3 and CP4 and to respective inverting or non-inverting input of operational amplifier 602. The size of the capacitances of C5 and C6 are the same and are CP/(G−1), where CP represents the capacitance of the parasitic capacitors CP3 and CP4. In much the same way as described above, it can be seen that the charge on the inverting and non-inverting inputs to operational amplifier 602 remains approximately zero despite the parasitic capacitance and a non-ideal operational amplifier.

The above discussion is meant to be illustrative of the principles and various examples described herein. Numerous variations and modifications are possible. It is intended that the following claims be interpreted to embrace all such variations and modifications.

What is claimed is:

1. A circuit, comprising:
    an operational amplifier including a positive input, a negative input, a first internal node that is to include a voltage that is based on and larger than a voltage on the positive input, and a second internal node that is to include a voltage that is based on and larger than a voltage on the negative input;
    a first input node and a second input node of the circuit;
    a mixer including a plurality of switches to switch the first and second input nodes between the positive and negative inputs of the operational amplifier in accordance with clock signals controlling the plurality of switches in the mixer, wherein the plurality of switches includes a first switch to selectively couple the first input node to the negative input of the operational amplifier and a second switch to selectively couple the first input node to the positive input of the operational amplifier;
    a cancellation capacitor coupled to the first input node;
    a third switch to selectively couple the cancellation capacitor to the first internal node of the operational amplifier; and
    a fourth switch to selectively couple the cancellation capacitor to the second internal node of the operational amplifier;
    wherein the second and third switches are coupled to receive a first clock signal and the first and fourth switches are coupled to receive a second clock signal.

2. The circuit of claim 1, wherein the cancellation capacitor is a first cancellation capacitor, and wherein the mixer includes a fifth switch to selectively couple the second input node to the negative input of the operational amplifier and a sixth switch to selectively couple the second input node to the positive input of the operational amplifier, and wherein the circuit further comprises:
    a second cancellation capacitor coupled to the second input node;
    a seventh switch to selectively couple the second cancellation capacitor to the first internal node of the operational amplifier, wherein the sixth and seventh switches are coupled to receive the second clock signal; and
    an eighth switch to selectively couple the second cancellation capacitor to the second internal node of the operational amplifier, wherein the fifth and eighth switches are coupled to receive the first clock signal.

3. The circuit of claim 2, wherein the operational amplifier is a first operational amplifier and the circuit further includes a second operational amplifier coupled to the mixer, wherein the second operational amplifier includes a positive input and a negative input, a third internal node that is to include a voltage that is a based on and larger than a voltage on the positive input of the second operational amplifier, and a fourth internal node that is to include a voltage that is based on and larger than a voltage on the negative input of the second operational amplifier.

4. The circuit of claim 3, wherein the mixer includes a ninth switch to selectively couple the first input node to the negative input of the second operational amplifier, a tenth switch to selectively couple the second input node to the positive input of the second operational amplifier, an eleventh switch to selectively couple the first input node to the positive input of the second operational amplifier, and a twelfth switch to selectively couple the second input node to the positive input of the second operational amplifier, and wherein the circuit further includes:
- a thirteenth switch to selectively couple the second cancellation capacitor to the fourth internal node of the second operational amplifier;
- a fourteenth switch to selectively couple the first cancellation capacitor to the fourth internal node of the second operational amplifier;
- a fifteenth switch to selectively couple the first cancellation capacitor to the third internal node of the second operational amplifier;
- a sixteenth switch to selectively couple the second cancellation capacitor to the third internal node of the second operational amplifier.

5. The circuit of claim 4, wherein:
the ninth, twelfth, fourteenth, and sixteenth switches are coupled to receive a third clock signal; and
the tenth, eleventh, thirteenth, and fifteenth switches are coupled to receive a fourth clock signal.

6. The circuit of claim 5, further comprising:
a first buffer coupled between the first internal node and a node connecting the third switch to the seventh switch;
a second buffer coupled between the second internal node and a node connecting the fourth switch to the eighth switch;
a third buffer coupled between the fourth internal node and a node connecting the thirteenth switch to the fourteenth switch; and
a fourth buffer coupled between the third internal node and a node connecting the fifteenth switch to the sixteenth switch.

7. The circuit of claim 1, wherein the cancellation capacitor has a capacitance value that is approximately a value of C/(G−1), wherein C is a value of a parasitic capacitance of the circuit and G is a gain of the first operational amplifier.

8. The circuit of claim 1, further comprising:
a first buffer coupled between the first internal node and the third switch; and
a second buffer coupled between the second internal node and the fourth switch.

9. A circuit, comprising:
first and second operational amplifiers, each operational amplifier including a positive input, a negative input, a first internal node that is to include a voltage that is based on and larger than a voltage on that operational amplifier's positive input, and a second internal node that is to include a voltage that is based on and larger than a voltage on that operational amplifier's negative input;
a first input node and a second input node of the circuit;
a mixer coupled to the first and second input nodes and to the positive and negative inputs of the first and second operational amplifiers, wherein the mixer is to switch the first and second input nodes between the positive and negative inputs of the first and second operational amplifiers in accordance with clock signals;
a first cancellation capacitor coupled to the first input node;
a second cancellation capacitor coupled to the second input node;
first and second switches to selectively couple the first cancellation capacitor to the first and second internal nodes, respectively, of the first operational amplifier; and
third and fourth switches to selectively couple the second cancellation capacitor to the first and second internal nodes, respectively, of the second operational amplifier.

10. The circuit of claim 9, wherein the first, second, third, and fourth switches are coupled to receive different clock signals.

11. The circuit of claim 9, wherein the mixer comprises a fifth switch to selectively couple the first input node to the negative input of the first operational amplifier and a sixth switch to selectively couple the first input node to the positive input of the first operational amplifier, and wherein the first and sixth switches are coupled to receive a first clock signal and the second and fifth switches are coupled to receive a second clock signal.

12. The circuit of claim 11, wherein the mixer further comprises a seventh switch to selectively couple the second input node to the negative input of the second operational amplifier and an eighth switch to selectively couple the second input node to the positive input of the second operational amplifier, and wherein the fourth and eighth switches are coupled to receive a third clock signal and the third and seventh switches are coupled to receive a fourth clock signal.

13. The circuit of claim 12, further comprising:
a ninth switch to selectively couple the second input node to the negative input of the first operational amplifier, wherein the ninth switch is coupled to receive the first clock signal;
a tenth switch to selectively couple the second input node to the positive input of the first operational amplifier, wherein the tenth switch is coupled to receive the second clock signal;
an eleventh switch to selectively couple the first input node to the negative input of the first operational amplifier, wherein the eleventh switch is coupled to receive the third clock signal; and
a twelfth switch to selectively couple the first input node to the positive input of the first operational amplifier, wherein the twelfth switch is coupled to receive the fourth clock signal.

14. The circuit of claim 10, further comprising:
a fifth switch to selectively to selectively couple the second cancellation capacitor to the first internal node of the first operational amplifier; and
a sixth switch to selectively to selectively couple the second cancellation capacitor to the second internal node of the first operational amplifier.

15. The circuit of claim 14, further comprising:
a seventh switch to selectively to selectively couple the first cancellation capacitor to the first internal node of the first operational amplifier; and
an eighth switch to selectively to selectively couple the first cancellation capacitor to the second internal node of the first operational amplifier.

16. A circuit, comprising:
an operational amplifier including a positive input, a negative input, a first internal node that is to include a voltage that is based on and larger than a voltage on the positive input, and a second internal node that is to include a voltage that is based on and larger than a voltage on the negative input;
a first input node and a second input node of the circuit;
a mixer coupled to the first and second input nodes and to the positive and negative inputs of the operational amplifier, wherein the mixer is to switch the first and second input nodes between the positive and negative inputs of the operational amplifier;
a first cancellation capacitor coupled to the first input node; and
first and second switches to selectively couple the first cancellation capacitor to the first and second internal nodes, respectively, of the operational amplifier.

17. The circuit of claim 16, wherein the operational amplifier is a first operational amplifier and the circuit includes:
a second operational amplifier coupled to the mixer;
a second cancellation capacitor coupled to the second input node; and
third and fourth switches to selectively couple the second cancellation capacitor to the first and second internal nodes, respectively of the second operational amplifier.

18. The circuit claim 17, wherein the first, second, third, and fourth switches are coupled to receive different clock signals.

19. The circuit of claim 18, wherein different clock signals are time-delayed from one another.

20. The circuit of claim 16, wherein the operational amplifier includes a differential input stage that includes the first and second internal nodes.

* * * * *